United States Patent
Lee et al.

(10) Patent No.: US 11,682,796 B2
(45) Date of Patent: Jun. 20, 2023

(54) INTEGRATED SWITCHING DEVICE, AND BATTERY MONITORING AND PROTECTING SYSTEM INCLUDING INTEGRATED SWITCHING DEVICE

(71) Applicant: LG Chem, Ltd., Seoul (KR)

(72) Inventors: Chang Bog Lee, Daejeon (KR); Jae Chan Lee, Daejeon (KR)

(73) Assignee: LG Energy Solution, Ltd.

( * ) Notice: Subject to any disclaimer, the term of this patent is extended or adjusted under 35 U.S.C. 154(b) by 514 days.

(21) Appl. No.: 16/635,413

(22) PCT Filed: Mar. 8, 2019

(86) PCT No.: PCT/KR2019/002694
§ 371 (c)(1),
(2) Date: Jan. 30, 2020

(87) PCT Pub. No.: WO2019/177308
PCT Pub. Date: Sep. 19, 2019

(65) Prior Publication Data
US 2020/0161714 A1    May 21, 2020

(30) Foreign Application Priority Data
Mar. 16, 2018 (KR) .................. 10-2018-0030782

(51) Int. Cl.
*G01R 15/14* (2006.01)
*G01R 31/327* (2006.01)
(Continued)

(52) U.S. Cl.
CPC .......... *H01M 10/425* (2013.01); *G01R 15/14* (2013.01); *G01R 31/327* (2013.01);
(Continued)

(58) Field of Classification Search
CPC ........ H01M 10/425; H01M 2010/4271; G01R 15/14; G01R 31/327; G01R 19/16542;
(Continued)

(56) References Cited

U.S. PATENT DOCUMENTS 5,898,557 A    4/1999    Baba et al.
6,351,361 B1   2/2002    Kawazu et al.
(Continued)

FOREIGN PATENT DOCUMENTS

CN    103580001 A        2/2014
DE    20315849 U1 *      3/2004    ........... H01H 39/006
(Continued)

OTHER PUBLICATIONS

Rémy Ouaida, Jean Francois de Palma, Gilles Gonthier. Hybrid Protection based on Pyroswitch and Fuse Technologies for DC Applications. Symposium de Genie Electrique, Jun. 2016, Grenoble, France (Year: 2016).*
(Continued)

*Primary Examiner* — Daniel R Miller
(74) *Attorney, Agent, or Firm* — Lerner David LLP (57) ABSTRACT

An integrated switching device in which a contactor unit which is capable of controlling a continuity state of an electric circuit, a blocking unit which is capable of cutting a contactor and blocking a current when abnormality is generated in the contactor or a current having a size exceeding a permitted current range of the contactor is generated, and a current measuring unit which is capable of measuring a current by using shunt resistor are integrated into one device, thereby performing various functions only with one device.

9 Claims, 5 Drawing Sheets

(51) Int. Cl.
*H01M 10/42* (2006.01)
*H02J 7/00* (2006.01)

(52) U.S. Cl.
CPC .......... *H02J 7/0031* (2013.01); *H02J 7/0063* (2013.01); *H01M 2010/4271* (2013.01)

(58) Field of Classification Search
CPC .......... H02J 7/0031; H02J 7/0063; H02J 7/00; Y02T 90/16; B60L 2240/549; B60L 3/0046; B60L 3/04; Y02E 60/10; H01H 39/00; H01H 39/006; H01H 2039/008; H01H 39/002; H01H 39/004
See application file for complete search history.

(56) References Cited

U.S. PATENT DOCUMENTS

| | | | |
|---|---|---|---|
| 2003/0007304 A1* | 1/2003 | Merkle | H01H 50/021 361/139 |
| 2005/0174711 A1 | 8/2005 | Nagai et al. | |
| 2013/0154352 A1* | 6/2013 | Tokarz | B60L 3/0046 307/9.1 |
| 2013/0307351 A1* | 11/2013 | Kusch | H01H 47/001 307/125 |
| 2014/0030557 A1 | 1/2014 | Kim | |
| 2014/0333314 A1* | 11/2014 | Kaupp | G01R 31/382 324/426 |
| 2015/0032311 A1* | 1/2015 | Shao | H02M 7/53871 903/906 |
| 2015/0188338 A1 | 7/2015 | Moon et al. | |
| 2015/0255975 A1 | 9/2015 | Siciak et al. | |
| 2018/0013279 A1* | 1/2018 | Siciak | B60L 53/14 |
| 2018/0069388 A1 | 3/2018 | Kim | |
| 2018/0248354 A1 | 8/2018 | Sugisawa | |
| 2018/0350540 A1* | 12/2018 | Sullivan | H01H 50/18 |
| 2019/0013168 A1 | 1/2019 | Waag | |

FOREIGN PATENT DOCUMENTS

| | | | |
|---|---|---|---|
| DE | 102016204287 A1 | | 9/2017 |
| DE | 102016216829 A1 | * | 3/2018 |
| DE | 102016216829 A1 | | 3/2018 |
| EP | 2642656 A1 | | 9/2013 |
| JP | 2003209922 A | | 7/2003 |
| JP | 2004297866 A | | 10/2004 |
| JP | 2005243652 A | | 9/2005 |
| JP | 20140166033 A | | 9/2014 |
| JP | 2014220924 A | | 11/2014 |
| JP | 20160147558 A | | 8/2016 |
| JP | 2017041987 A | | 2/2017 |
| JP | 2017073906 A | | 4/2017 |
| KR | 20130086613 A | | 8/2013 |
| KR | 20140017043 A | | 2/2014 |
| KR | 20150076843 A | | 7/2015 |
| KR | 20160061825 A | | 6/2016 |
| KR | 20160112417 A | | 9/2016 |
| KR | 20170002298 A | | 1/2017 |
| KR | 20180027897 A | | 3/2018 |

OTHER PUBLICATIONS

Tung Chao, "Electronically controlled current limiting fuses," Conference Record of 1995 Annual Pulp and Paper Industry Technical Conference, 1995, pp. 205-222 (Year: 1995).*
International Search Report for Application No. PCTKR2019002694, dated Jun. 19, 2019, 2 pages.
Extended European Search Report for Application No. EP19767343 dated Dec. 21, 2020.
Search Report dated Feb. 27, 2023 from the Office Action for Chinese Application No. 201980003989.2 dated Mar. 3, 2023, 3 pages. [See p. 1-2, categorizing the cited references].

* cited by examiner

INTEGRATED SWITCHING DEVICE, AND BATTERY MONITORING AND PROTECTING SYSTEM INCLUDING INTEGRATED SWITCHING DEVICE

TECHNICAL FIELD

This application claims priority to and the benefit of Korean Patent Application No. 10-2018-0030782 filed in the Korean Intellectual Property Office on Mar. 16, 2018, the entire contents of which are incorporated herein by reference.

The present invention relates to an integrated switching device, and particularly, to an integrated switching device in which a contactor unit which is capable of controlling a continuity state of an electric circuit, a blocking unit which is capable of cutting a contactor and blocking a current when abnormality is generated in the contactor or a current having a size exceeding a permitted current range of the contactor is generated, and a current measuring unit which is capable of measuring a current by using shunt resistor are integrated into one device, thereby performing various functions only with one device.

BACKGROUND ART

In general, a secondary battery may be used as one battery module by joining a plurality of unit secondary battery cells in an environment requiring a high capacity, such as an electric vehicle, an energy storage system, and an uninterruptible power supply, and the plurality of battery modules may be joined and used depending on the case.

When the plurality of battery modules is used together, the battery module is overheated due to an abnormal operation, such as an over current and an over voltage, and thus a problem in that the battery module may explode and become damaged and the like may occur. In order to solve the problem, there is a need for a technology for always measuring and monitoring information on various states, such as a voltage, a current, and a temperature, of each individual module when a plurality of battery modules are bonded and used and preventing a load from being damaged due to a problem generable due to abnormality, such as an overcurrent, of a battery, and the like.

In the meantime, in the related art, a fuse is used for protecting a system from a high current generated due to a short circuit. However, the fuse has a problem in that an operation time is delayed or the fuse is not operated in a low-current situation, not a high-current situation, so that for a section in which the fuse is not operated or an operation time is delayed, a method of recognizing an abnormal current by a separate current sensor and blocking a current by opening a switch is used.

Further, in the related art, in order to protect a battery from an overvoltage, a method of opening a contactor by using a signal when an abnormal symptom is found after a voltage is sensed from the outside is used, and a current is also measured by using an external current sensor.

However, a battery monitoring and protecting circuit in the related art needs to include various elements for performing various functions, and elements need to be additionally provided for supplementing problems and faults of the elements, so that there is a problem in that a volume and cost of a system are increased.

DETAILED DESCRIPTION OF THE INVENTION

Technical Problem

The present invention is conceived to solve the problems, and an object of the present invention provides an integrated switching device, in which a contactor unit controlling a continuity state of an electric circuit, a blocking unit blocking a current flowing in the contactor unit, and a current measuring unit measuring a current flowing in the contactor unit are included in one housing and integrated into one device, thereby decreasing a volume and cost of a system.

Technical Solution

An exemplary embodiment of the present invention provides an integrated switching device, including: a contactor unit located in an electric circuit and configured to control a continuity state of the electric circuit based on a control signal; a blocking unit configured to block a current flowing in the contactor unit; and a current measuring unit configured to measure a current flowing in the contactor unit, in which the contactor unit, the blocking unit, and the current measuring unit are included in one housing.

In the exemplary embodiment, the contactor unit may include: a positive electrode contactor unit and a negative electrode contactor unit connected with the electric circuit; and a connecting unit configured to electrically connect and disconnect the positive electrode contactor unit and the negative electrode contactor unit based on the control signal.

In the exemplary embodiment, the blocking unit may be located to be adjacent to any one or more of the positive electrode contactor unit, the negative electrode contactor unit, and the connecting unit, and when the continuity state of the electric circuit is not controlled even though the control signal is received, the blocking unit may explode and cut any one or more of the positive electrode contactor unit, the negative electrode contactor unit, and the connecting unit to block the current flowing in the contactor unit.

In the exemplary embodiment, when a size of the measured current exceeds a predetermined size of a current, the blocking unit may explode and cut any one or more of the positive electrode contactor unit, the negative electrode contactor unit, and the connecting unit regardless of the reception of the control signal to block the current flowing in the contactor unit.

In the exemplary embodiment, the contactor unit may further include one or more shunt resistors included in any one or more of the positive electrode contactor unit, the negative electrode contactor unit, and the connecting unit, and the current measuring unit may measure a current flowing in the contactor unit by using the one or more shunt resistors.

In the exemplary embodiment, the current measuring unit may transmit the measured current to the outside by using Controller Area Network (CAN) communication.

In the exemplary embodiment, the blocking unit may include one or more Power Disconnect Devices (PDD).

Advantageous Effects

According to the present invention, a contactor unit controlling a continuity state of an electric circuit, a blocking unit blocking a current flowing in the contactor unit, and a current measuring unit measuring a current flowing in the contactor unit are included in one housing to be integrated into one device, so that it is possible to decrease a volume and cost of a system.

MODE FOR CARRYING OUT THE INVENTION

Hereinafter, an exemplary embodiment is presented for helping understanding of the present invention. However, the exemplary embodiment below is simply provided for easier understanding of the present invention, and the contents of the present invention are not limited by the exemplary embodiment.

Figure 1:
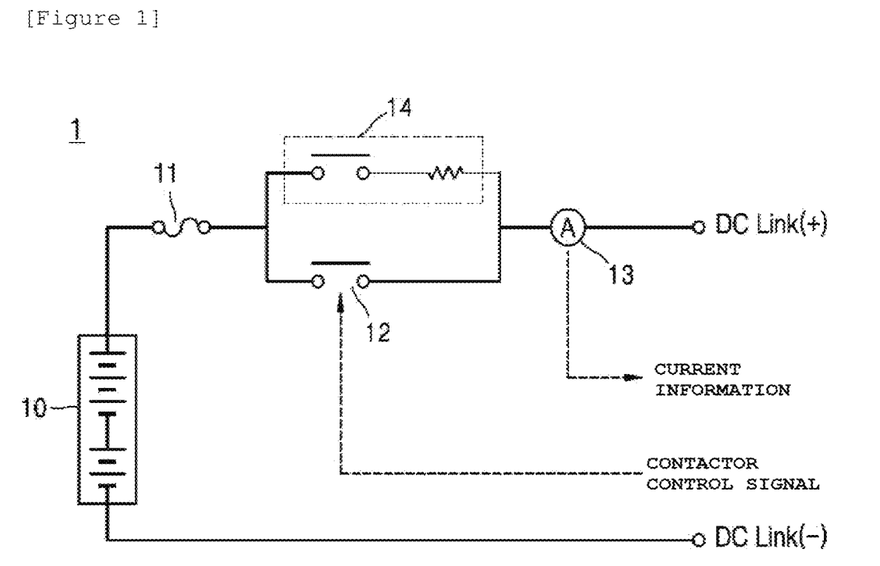
FIG. 1 is a diagram schematically illustrating a battery monitoring and protecting system 1 in the related art.

FIG. 1 is a diagram schematically illustrating a battery monitoring and protecting system 1 in the related art.

Referring to FIG. 1, in the related art, a current fuse 11 is used for protecting a load from a high current generated due to abnormality, such as a short circuit. However, the current fuse 11 may have a delayed operation time or may not be operated in a low-current situation, not a high-current situation.

Accordingly, for a section in which the fuse is not operated or an operation time is delayed, a method of recognizing an abnormal current by a current sensor 13 and opening a relay 12 by a Battery Management System (BMS) to block a current is used. Herein, the relay 12 may include all of the mechanical and electrical relays.

In addition, in order to protect a battery from an overvoltage, when a voltage sensor (not illustrated) located outside senses a voltage and then finds an abnormal symptom, a scheme of outputting a contactor control signal and opening the relay 12 is used, and in order to measure a current, the external current sensor 13 is used and a scheme of transmitting corresponding information to a Micro Controller Unit (MCU) through separate communication is used.

As a result, there is a disadvantage in that various components, such as the current fuse 11, the relay 12, and the current sensor 13, are required for performing a protective operation against voltage and current abnormality situations. Hereinafter, an integrated switching device 100 according to an exemplary embodiment of the present invention which is capable of overcoming the disadvantage of the battery monitoring and protecting system 1 in the related art will be described with reference to FIGS. 2 to 7.

Figure 2:
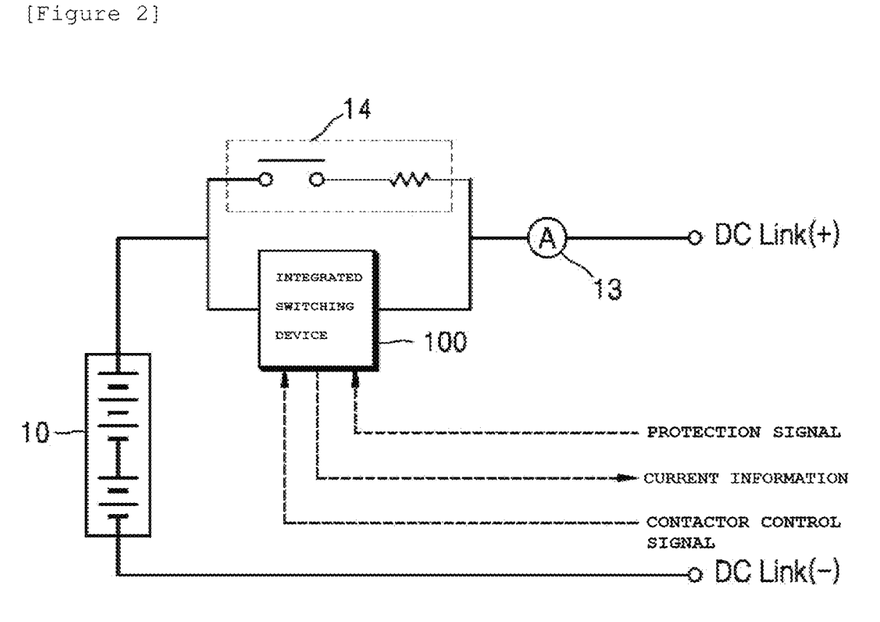
FIG. 2 is a diagram schematically illustrating the form in which an integrated switching device 100 according to an exemplary embodiment of the present invention is applied to the battery monitoring and protecting system 1 in the related art.
Figure 3:
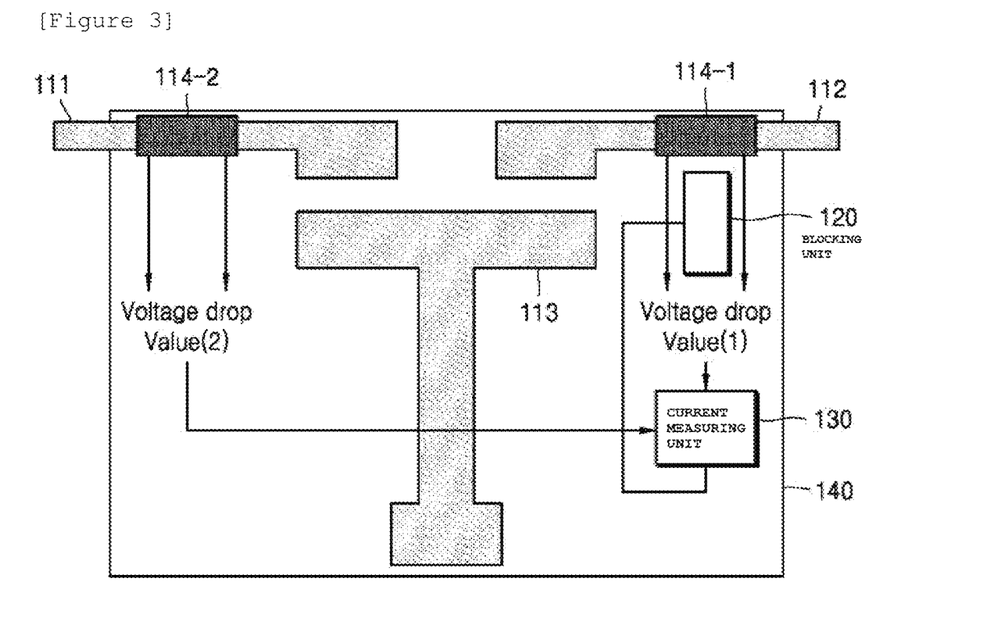
FIGS. 3 and 4 are diagrams schematically illustrating a configuration of the integrated switching device 100 according to the exemplary embodiment of the present invention.
Figure 4:
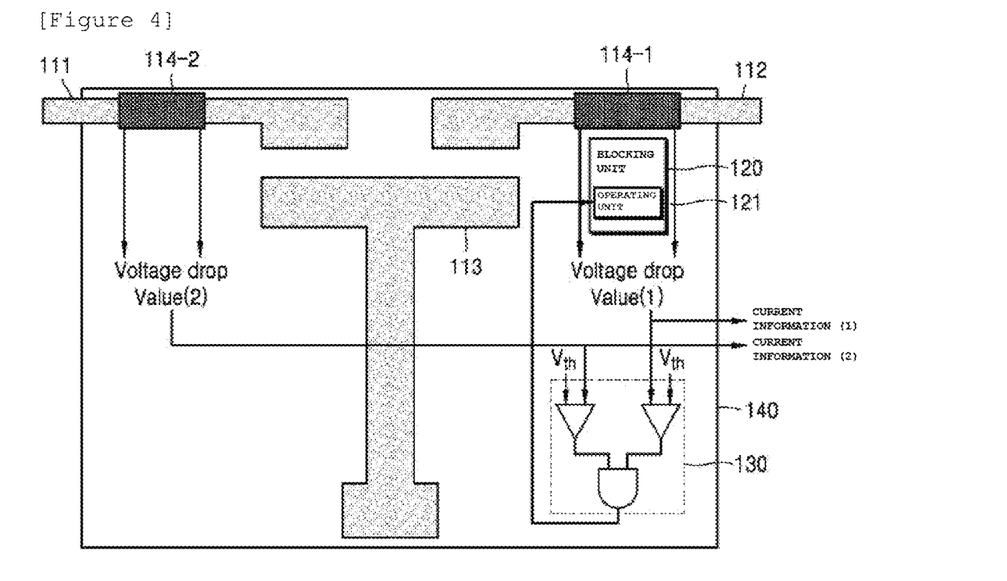

FIG. 2 is a diagram schematically illustrating the form in which the integrated switching device 100 according to the exemplary embodiment of the present invention is applied to the battery monitoring and protecting system 1 in the related art, and FIGS. 3 and 4 are diagrams schematically illustrating a configuration of the integrated switching device 100 according to the exemplary embodiment of the present invention.

Referring to FIGS. 2 to 4, the integrated switching device 100 according to the exemplary embodiment of the present invention may include a contactor unit 110, a blocking unit 120, a current measuring unit 130, and a housing 140.

Herein, the integrated switching device 100 illustrated in FIGS. 2 to 4 is the exemplary embodiment, and constituent elements thereof are not limited to the exemplary embodiment illustrated in FIGS. 2 to 4, and may be added, changed, or removed as necessary. For example, a current measuring unit 130 may be connected to each of a positive electrode contactor unit 111 and a negative electrode contactor unit 112 included in the contactor unit 110.

Figure 5:
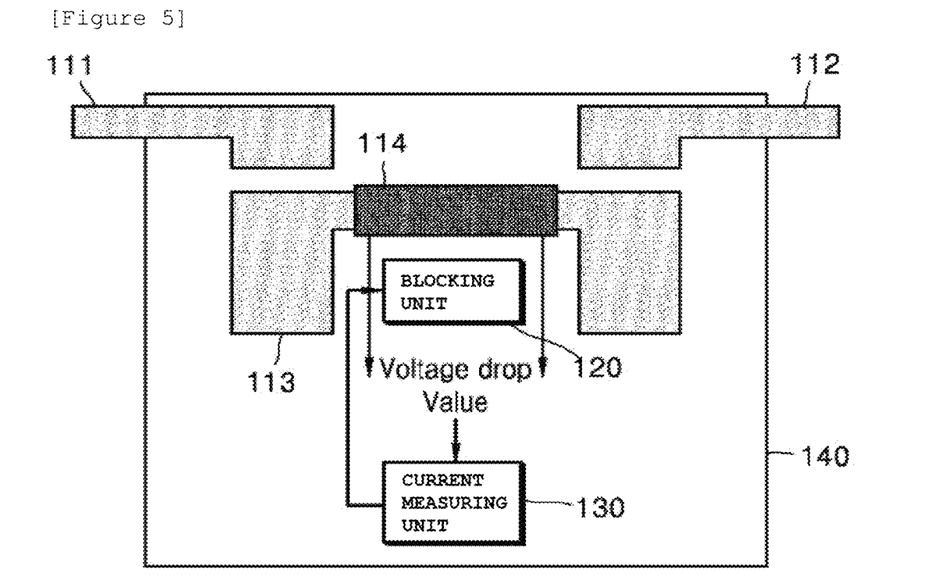
FIG. 5 is a diagram schematically illustrating a configuration of an integrated switching device 100' according to another exemplary embodiment of the present invention.
Figure 6:
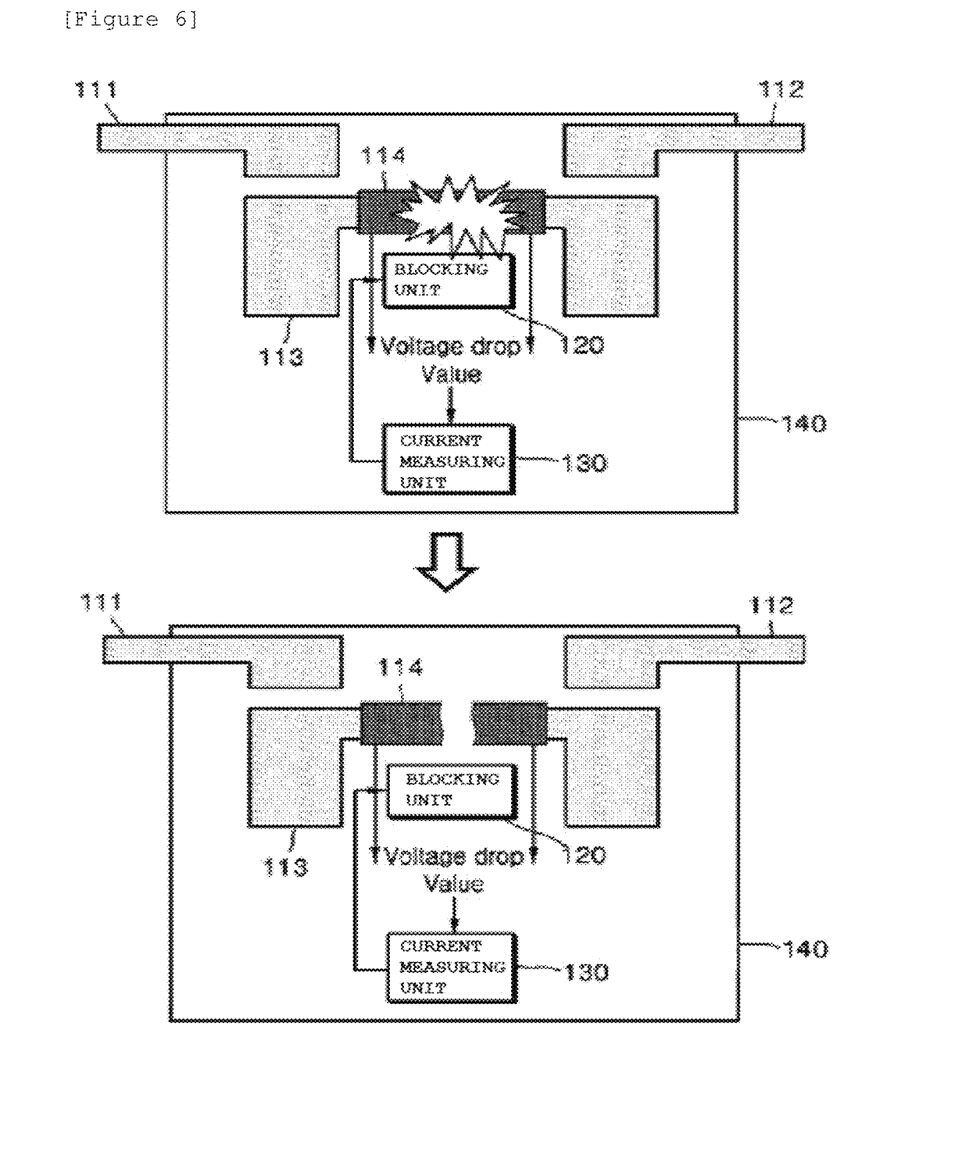
FIG. 6 is a diagram schematically illustrating the form in which a blocking unit 120 is operated to explode and cut a shunt resistor 114 in the integrated switching device 100' according to another exemplary embodiment of the present invention.
Figure 7:
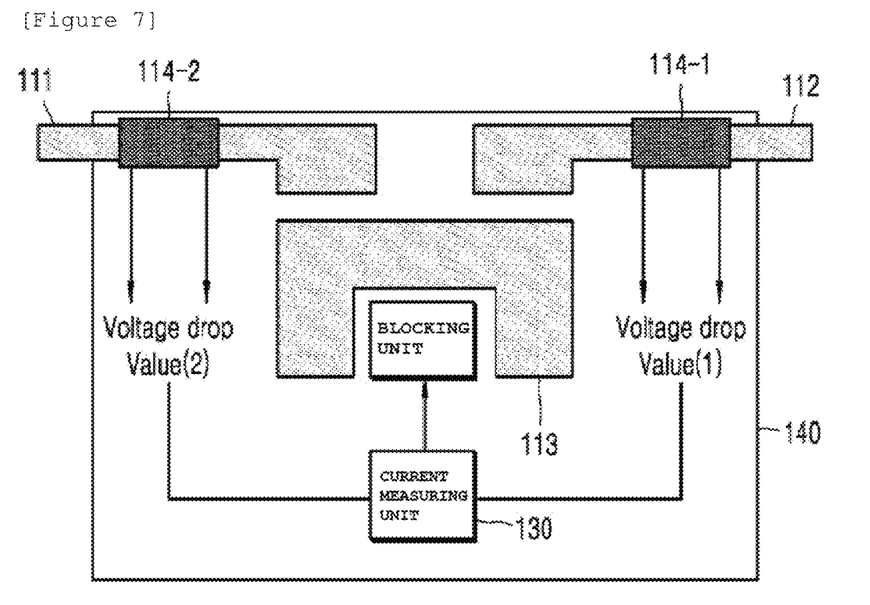
FIG. 7 is a diagram schematically illustrating a configuration of an integrated switching device 100" according to another exemplary embodiment of the present invention.

Further, FIG. 5 is a diagram schematically illustrating a configuration of an integrated switching device 100' according to another exemplary embodiment of the present invention, FIG. 6 is a diagram schematically illustrating the form in which a blocking unit 120 is operated to explode and cut a shunt resistor 114 in the integrated switching device 100' according to another exemplary embodiment of the present invention, and FIG. 7 is a diagram schematically illustrating a configuration of an integrated switching device 100' according to another exemplary embodiment of the present invention.

The integrated switching device 100' according to another exemplary embodiment of the present invention and the integrated switching device 100" according to another exemplary embodiment of the present invention illustrated in FIGS. 5 to 7 only have structural differences, such as locations of the constituent elements, and the kinds and the roles of constituent elements illustrated in the integrated switching device 100 according to the exemplary embodiment of the present invention, the integrated switching device 100' according to another exemplary embodiment of the present invention, and the integrated switching device 100" according to another exemplary embodiment of the present invention may be the same.

First, the contactor unit 110 may be located in an electric circuit and connected with the electric circuit, and control a continuity state of the electric circuit based on a control signal. To this end, the contactor unit 110 may include the positive electrode contactor unit 111, the negative electrode contactor unit 112, and a connecting unit 113.

Herein, the continuity state may mean an on-state in which the electric circuit is connected without a disconnection to form a closed circuit, so that a current flows in the electric circuit, and an off-state in which one side of the electric circuit is opened or short-circuited to form an open circuit, so that a current cannot flow in the electric circuit.

Further, herein, the control signal means a signal for controlling the contactor unit 110 for changing a continuity state of the electric circuit. For example, the control signal may be a signal output from a control unit located outside for controlling a continuity state of the electric circuit from an on state to an off state or from an off state to an on state by connecting or disconnecting the contactor unit 110.

The positive electrode contactor unit 111 may be connected to a positive electrode terminal side of a battery 10 provided in the electric circuit, and the negative electrode contactor unit 112 may be connected to a load side (DC link (+) terminal side).

The connecting unit 113 may electrically connect and disconnect the positive electrode contactor unit 111 and the negative electrode contactor unit 112 based on the control signal.

In the exemplary embodiment, the connecting unit 113 may be formed in the form of "T" for locating a blocking part 130, which is to be described below, at the side of the positive electrode contactor unit 111 and the negative electrode contactor unit 112 as illustrated in FIGS. 3 and 4, and may be formed in the form of "c" for locating the blocking part 130, which is to be described below, at an inner side of the connecting unit 113 as illustrated in FIGS. 5 to 7. However, the present invention is not limited thereto.

In the exemplary embodiment, the connecting unit 113 may include a signal line (not illustrated) receiving a signal output from the outside, and may receive a signal controlling a connection and a disconnection between the positive electrode contactor unit 111 and the negative electrode contactor unit 112 through the signal line.

In the exemplary embodiment, the positive electrode contactor unit 111, the negative electrode contactor unit 112, and the connecting unit 113 may be formed with an electricity connection metal including an electroconductive metal, such as gold (Au), silver (Ag), copper (Cu), aluminum (Al), or platinum (Pt), and when a contact point (not illustrated) formed in the connecting unit 113 is attached to or detached from the positive electrode contactor unit 111 and the negative electrode contactor unit 112, a continuity state of the electric circuit may be changed. However, the present invention is not limited thereto.

In the exemplary embodiment, any one or more of the positive electrode contactor unit 111, the negative electrode contactor unit 112, and the connecting unit 113 may include one or more shunt resistors 114. For example, as illustrated in FIGS. 3 and 4, the positive electrode contactor unit 111 and the negative electrode contactor unit 112 may include shunt resistors 114-1 and 114-2. However, the present invention is not limited thereto, and the connecting unit 113 includes the shunt resistor 114 as illustrated in FIG. 5, or all of the positive electrode contactor unit 111, the negative electrode contactor unit 112, and the connecting unit 113 may include shunt resistors 114.

The blocking unit 120 may block a current flowing in the contactor unit 110. To this end, the blocking unit 120 may include one or more power disconnect devices (PDD).

The PDD is a component performing a protective function, and is a component applied to an airbag of a vehicle and the like. The PDD may cut the constituent element by exploding the constituent element by an input signal. That is, the blocking unit 120 may be located to be adjacent to any one or more of the positive electrode contactor unit 111, the negative electrode contactor unit 112, and the connecting unit 113, and when the PDD included in the blocking unit 120 is exploded, any one or more of the positive electrode contactor unit 111, the negative electrode contactor unit 112, and the connecting unit 113 located to be adjacent to the blocking unit 120 may be cut.

In another exemplary embodiment, a blocking unit 120 may include a heat radiating body (not illustrated), and when an electricity conducting metal included in any one or more of a positive electrode contactor unit 111, a negative electrode contactor unit 112, and a connecting unit 113 is melted by applying heat generated in the heat radiating body to a contactor unit 110, the blocking unit 120 may cut any one or more of the positive electrode contactor unit 111, the negative electrode contactor unit 112, and the connecting unit 113.

In another exemplary embodiment, a positive electrode contactor unit 111, a negative electrode contactor unit 112, and a connecting unit 113 may include a specific metal having a size of a second reference current as a melting point, and when a current exceeding the size of the second reference current is applied by using a material characteristic of the specific metal, the specific metal is melted, so that any one or more of the positive electrode contactor unit 111, the negative electrode contactor unit 112, and the connecting unit 113 may be cut.

In the exemplary embodiment, when the continuity state of the electric circuit is not controlled even though the control signal is received, the blocking unit 120 may explode and cut any one or more of the positive electrode contactor unit 111, the negative electrode contactor unit 112, and the connecting unit 113 to block the current flowing in the contactor unit 110. For example, when the control signal including a command controlling the continuity state of the electric circuit from the on state to the off state is received from the outside, but the contactor unit 110 is not disconnected and the continuity state of the electric circuit is maintained in the on state, the blocking unit 120 may explode and cut any one or more of the adjacent positive electrode contactor unit 111, negative electrode contactor unit 112, and connecting unit 113 to block the current flowing in the contactor unit 110.

In the exemplary embodiment, when the continuity state of the electric circuit is not controlled for a predetermined time after the control signal is received, the blocking unit 120 may explode and cut any one or more of the positive electrode contactor unit 111, the negative electrode contactor unit 112, and the connecting unit 113. However, the present invention is not limited thereto.

In the exemplary embodiment, when a size of a current measured by the current measuring unit 130 which is to be described below exceeds a predetermined size of a current, the blocking unit 120 may explode and cut any one or more of the positive electrode contactor unit 111, the negative electrode contactor unit 112, and the connecting unit 113 regardless of the reception of the control signal to block the current flowing in the contactor unit 110.

Herein, the predetermined size of the current may mean a maximum value of a permitted current size of the fuse 11. For example, when a maximum permitted current value of the fuse 11 is 10 A, the predetermined size of the current may be set to 10 A. However, the present invention is not limited thereto.

The current measuring unit 130 may measure a current flowing in the contactor unit 110. For example, the current measuring unit 130 may measure a current flowing in the contactor unit 110 by using one or more shunt resistors 114 included in any one or more of the positive electrode contactor unit 111, the negative electrode contactor unit 112, and the connecting unit 113. However, the present invention is not limited thereto, and any method of measuring a current flowing in an electric circuit may be applied. For example, the current measuring unit 130 may measure a current flowing in an electric circuit by using a hall type current measurement scheme using a hall sensor.

In the exemplary embodiment, the current measuring unit 130 may transmit the measured current to the outside by using Controller Area Network (CAN) communication.

Herein, the CAN communication means a communication scheme of transmitting data through two-strand data wires which are twisted or shielded by coating. However, the present invention is not limited thereto, and any communication scheme of transmitting the current measured by the current measuring unit 130 to the outside may be applied.

In the exemplary embodiment, the current measuring unit 130 may include one or more comparators as illustrated in FIG. 4, and may compare the sizes of the currents flowing in the shunt resistors 114-1 and 114-2 with the predetermined size of the current through the comparator. The current measuring unit 130 may provide an operating unit 121 included in the blocking unit 120 with a comparison result output through one or more comparators, and the operating unit 121 may control an operation of the blocking unit 120 based on the comparison result. For example, when the size of the current measured by the current measuring unit 130 exceeds the predetermined size of the current, the comparator may output a high signal, and when the size of the current measured by the current measuring unit 130 is equal to or smaller than the predetermined size of the current, the comparator may output a low signal. In this case, when the comparator outputs the high signal, the operating unit 121 may operate the blocking unit 120 and explode and cut any one or more of the positive electrode contactor unit 111, the negative electrode contactor unit 112, and the connecting unit 113.

The housing 140 may form a space having a predetermined size so as to include the contactor unit 110, the blocking unit 120, and the current measuring unit 130 therein.

The housing 140 may locate the contactor unit 110, the blocking unit 120, and the current measuring unit 130 inside thereof and covers four directions to package the contactor unit 110, the blocking unit 120, and the current measuring unit 130 in one device.

Herein, in FIGS. 2 to 7, the housing 140 is only illustrated in a rectangular shape, but the present invention is not limited thereto, and the housing 140 may be changed to the form that is appropriate to a used space.

In the exemplary embodiment, the integrated switching device 100 according to the exemplary embodiment of the present invention may include a pyro switch (not illustrated).

The pyro switch may detect an abnormal situation, such as an overcurrent, of an electric circuit, and may apply a control signal commanding an off operation of the contactor unit 110 to the signal line included in the connecting unit 113 to make the contactor unit 110 be physically off.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. An integrated switching device, comprising:
  a contactor located in an electric circuit and configured to control a continuity state of the electric circuit based on a control signal, wherein the contactor includes a positive electrode contactor and a negative electrode contactor connected with the electric circuit and an electrical connector configured to electrically connect and disconnect the positive electrode contactor and the negative electrode contactor based on the control signal;
  a shunt resistor positioned on the contactor to measure a current flowing in the contactor;
  one or more power disconnect devices (PDD) positioned in a cavity of the electrical connector and configured to block the current flowing in the electrical connector by cutting the shunt resistor; and
  a current sensor including one or more comparators configured to compare a magnitude of current flowing in the shunt resistor with a predetermined current magnitude,
  wherein the contactor, the PDD, and the current sensor are included in one housing.

2. The integrated switching device of claim 1, wherein the PDD is positioned adjacent to any one or more of the positive electrode contactor, the negative electrode contactor, or the electrical connector, and wherein the PDD is configured to explode and cut the shunt resistor positioned on any one or more of the positive electrode contactor, the negative electrode contactor, or the electrical connector to block the current flowing in the contactor when the contactor does not control the continuity state of the electric circuit even though the control signal is received.

3. The integrated switching device of claim 1, wherein the PDD is configured to explode and cut the shunt resistor positioned on any one or more of the positive electrode contactor, the negative electrode contactor, or the electrical connector to block the current flowing in the contactor when a magnitude of the current flowing in the contactor measured by the current sensor exceeds a predetermined current magnitude regardless of whether the control signal is received by the contactor.

4. The integrated switching device of claim 1, wherein the shunt resistor is included in any one or more of the positive electrode contactor, the negative electrode contactor, or the electrical connector.

5. The integrated switching device of claim 4, wherein the current sensor includes a comparator, wherein the comparator is configured to compare the current flowing in the shunt resistor with the predetermined current magnitude, and wherein operation of the PDD is controlled based on a comparison result output through the comparator.

6. The integrated switching device of claim 1, wherein the current sensor is configured to transmit the measured current using Controller Area Network (CAN) communication.

7. The integrated switching device of claim 1, wherein the current sensor includes a hall effect sensor.

8. An integrated switching device, comprising:
  a contactor located in an electric circuit and configured to control a continuity state of the electric circuit based on a control signal, wherein the contactor includes a positive electrode contactor and a negative electrode contactor connected with the electric circuit and an electrical connector configured to electrically connect and disconnect the positive electrode contactor and the negative electrode contactor based on the control signal;
  a shunt resistor positioned on the contactor to measure a current flowing in the contactor;
  one or more power disconnect devices (PDD) configured to block the current flowing in the contactor by cutting the shunt resistor, wherein the PDD includes a heat radiating body, and wherein the PDD is configured to cut the shunt resistor positioned on any one or more of the positive electrode contactor, the negative electrode contactor, or the electrical connector to block the current flowing in the contactor when an electricity conducting metal included in any one or more of the positive electrode contactor, the negative electrode contactor, or the electrical connector is melted by heat from the heat radiating body applied to the contactor; and a current sensor including one or more comparators configured to compare a magnitude of current flowing in the shunt resistor with a predetermined current magnitude, wherein the contactor, the PDD, and the current sensor are included in one housing.

9. A system for monitoring and protecting a battery, comprising:

an integrated switching device including:

a contactor located in an electric circuit and configured to control a continuity state of the electric circuit based on a control signal, wherein the contactor includes a positive electrode contactor and a negative electrode contactor connected with the electric circuit and an electrical connector configured to electrically connect and disconnect the positive electrode contactor and the negative electrode contactor based on the control signal;

a shunt resistor positioned on the contactor or the electrical connector to measure a current flowing in the contactor;

a blocking unit positioned in a cavity of the electrical connector and configured to block the current flowing in the electrical connector by cutting the shunt resistor; and a current sensor including one or more comparators configured to compare a magnitude of current flowing in the shunt resistor with a predetermined current magnitude, wherein the contactor, the blocking unit, and the current sensor are included in one housing.

* * * * *